United States Patent [19]

Furuya et al.

[11] Patent Number: 4,541,093

[45] Date of Patent: Sep. 10, 1985

[54] METHOD AND APPARATUS FOR ERROR CORRECTION

[75] Inventors: Tsuneo Furuya; Katsuya Hori, both of Tokyo, Japan

[73] Assignee: Sony Corporation, Tokyo, Japan

[21] Appl. No.: 488,373

[22] Filed: Apr. 25, 1983

[30] Foreign Application Priority Data

Apr. 28, 1982 [JP] Japan .................................. 57-72220
Feb. 18, 1983 [JP] Japan .................................. 58-25815

[51] Int. Cl.³ ............................................. G06F 11/10
[52] U.S. Cl. ........................................ 371/40; 369/49; 371/38
[58] Field of Search ...................... 371/37, 38, 39, 40; 360/38.1, 53; 369/48, 49

[56] References Cited

U.S. PATENT DOCUMENTS

| | | | |
|---|---|---|---|
| 4,206,440 | 6/1980 | Doi et al. | 371/39 |
| 4,211,997 | 7/1980 | Rudnick et al. | 371/38 |
| 4,281,355 | 7/1981 | Wada et al. | 371/40 X |
| 4,380,071 | 4/1983 | Odaka | 371/40 |
| 4,408,326 | 10/1983 | Takeuchi et al. | 371/38 |
| 4,455,635 | 6/1984 | Dieterich | 371/40 X |
| 4,467,373 | 8/1984 | Taylor et al. | 371/40 X |

Primary Examiner—Charles E. Atkinson
Attorney, Agent, or Firm—Lewis H. Eslinger; Alvin Sinderbrand

[57] ABSTRACT

A method of error correction comprises error correction coding processing and interleaving and de-interleaving processings for digital subcoding data (as opposed to main data) in subchannels (as opposed to the main channel) to be transmitted. Apparatus is provided comprising means for performing those processings. The method comprises the steps of dividing digital subcoding data in one PACKET into a plurality of PACKs; adding a first redundant code for error detection or error correction to each of the PACKs; and interleaving the digital subcoding data in each of the PACKs and the first redundant code; whereby the interleaved data is transmitted together with frame sync signals and main data. The data in the subchannels is coded and interleaved and then recorded so that the distances between the data are maximized. Therefore, if errors should occur, the interpolation can be properly done, thereby improving the error correcting ability without requiring complicated error correction circuit or large buffer memory such as those required for the data in the main channel.

18 Claims, 20 Drawing Figures

FIG. 4A
(ZERO-mode)

| SYMBOL NUMBER | R | S | T | U | V | W |
|---|---|---|---|---|---|---|
| 0 | MODE | | | ITEM | | |
| 1 | 0 | 0 | 0 | 0 | 0 | 0 |
| 2 | . | . | . | . | . | . |
| . | . | . | . | . | . | . |
| . | . | . | . | . | . | . |
| . | . | . | . | . | . | . |
| 22 | . | . | . | . | . | . |
| 23 | 0 | 0 | 0 | 0 | 0 | 0 |

FIG. 4B
(GRAPHICS-mode)

| SYMBOL NUMBER | R | S | T | U | V | W |
|---|---|---|---|---|---|---|
| 0 | MODE | | | ITEM | | |
| 1 | INSTRUCTION | | | | | |
| 2 | CHECK DATA | | | | | |
| 3 | CHECK DATA | | | | | |
| 4 | | | | | | |
| . | | | DATA | | | |
| 19 | | | | | | |
| 20 | CHECK DATA | | | | | |
| 21 | CHECK DATA | | | | | |
| 22 | CHECK DATA | | | | | |
| 23 | CHECK DATA | | | | | |

FIG.5A $$Hp = \begin{bmatrix} 1 & 1 & 1 & \cdots & 1 & 1 \\ a^{23} & a^{22} & a^{21} & \cdots & a^{1} & 1 \\ a^{46} & a^{44} & a^{42} & \cdots & a^{2} & 1 \\ a^{69} & a^{66} & a^{63} & \cdots & a^{3} & 1 \end{bmatrix}$$

FIG.5B $$Hp = \begin{bmatrix} 1 & 1 & \cdots & 1 & 1 \\ a^{24} & a^{23} & \cdots & a^{2} & a^{1} \\ a^{48} & a^{46} & \cdots & a^{4} & a^{2} \\ a^{72} & a^{69} & \cdots & a^{6} & a^{3} \end{bmatrix}$$

FIG.5C $$Vp = \begin{bmatrix} S_{24n} \\ S_{24n+1} \\ Q_{24n+2} \\ Q_{24n+3} \\ S_{24n+4} \\ S_{24n+5} \\ S_{24n+6} \\ S_{24n+7} \\ S_{24n+8} \\ S_{24n+9} \\ S_{24n+10} \\ S_{24n+11} \\ S_{24n+12} \\ S_{24n+13} \\ S_{24n+14} \\ S_{24n+15} \\ S_{24n+16} \\ S_{24n+17} \\ S_{24n+18} \\ S_{24n+19} \\ P_{24n+20} \\ P_{24n+21} \\ P_{24n+22} \\ P_{24n+23} \end{bmatrix}$$

FIG.6A $$Hq = \begin{bmatrix} 1 & 1 & 1 & 1 \\ a^{3} & a^{2} & a^{1} & 1 \end{bmatrix}$$

FIG.6B $$Vq = \begin{bmatrix} S_{24n} \\ S_{24n+1} \\ Q_{24n+3} \\ Q_{24n+4} \end{bmatrix}$$

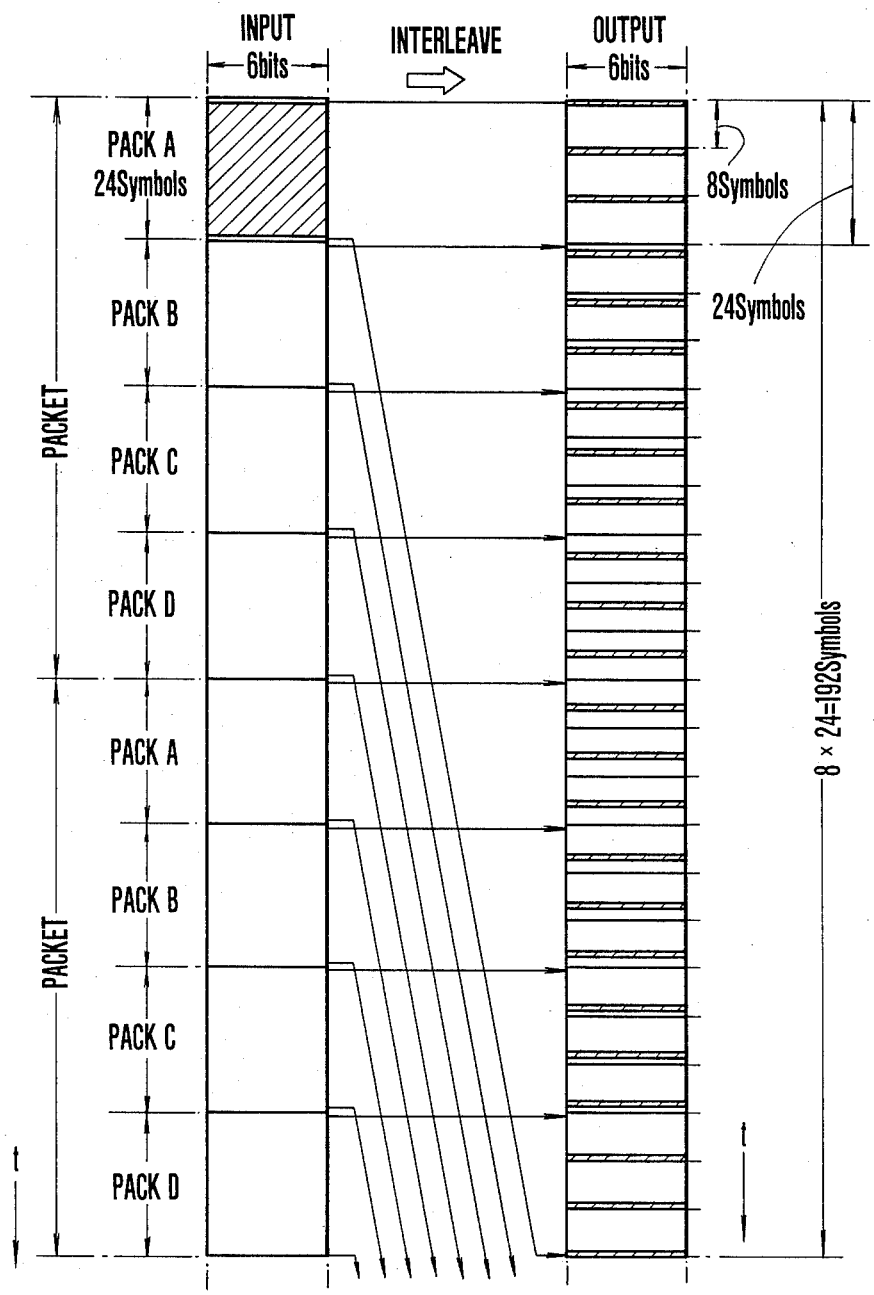
F I G. 10

METHOD AND APPARATUS FOR ERROR CORRECTION

BACKGROUND OF THE INVENTION

1. Field of the Invention

This invention relates to a method and an apparatus for error correction which are applied to digital information data when digital information signals are transmitted through a transmission line, such as an optical fiber, and to a method and an apparatus for reproducing the digital information signals coded thereby.

2. Description of the Prior Art

In an optical digital audio disc system (generally referred to as a compact disc system), a "mother" disc, a "stamper" disc, or the like is produced on the basis of the data reproduced from a master tape by an optically cutting apparatus similarly to a conventional analog disc. On such a "mother disc, a main channel consisting of digital audio signals and subcoding channels consisting of the data for control, display, or the like, and frames and syncs are recorded in spiral-like signal tracks. A number of replica discs are stamped from the "mother" disc.

Error correction coding processing which is described in detail in application Ser. Nos. 274,262, filed June 16, 1981, now abandoned; 275,328, filed June 19, 1981, now abandoned; 283,924, filed July 6, 1981, now abandoned; 536,824, filed Sept. 28, 1983, now U.S. Pat. No. 4,476,562, issued Oct. 9, 1984; 579,033, filed Feb. 15, 1984, now U.S. Pat. No. 4,497,058, issued Jan. 29, 1985; 613,761, filed May 24, 1984, now abandoned; and 684,161, filed Dec. 21, 1984 is performed with respect to the main channel. Eight channels called P, Q, R, S, T, U, V, and W are provided for the subcoding channels. The P and Q channels among these eight subcoding channels are used for selection of music programs and for rapid access operation to reproduce the beginnings of music programs when a compact disc is played back. Display data or audio data is interposed in the remaining six channels R through W. For example, picture of audio data to explain a composer, performers, or the like of a music program recorded in the main channel is recorded in these 6 channels R-W.

It is necessary to record in these subcoding channels not only the data to be actually displayed and output but also control data such as instructions or the like to indicate the kind of above-mentioned inherent output data and to process the data in the subcoding channels. However, the data format of the subcoding channels is not defined in detail and a method for error correction thereof has not previously been proposed. Furthermore, this control data is required in order to correctly process the display or audio data in the subcoding channels and is more significant than the display or audio data. Therefore, to the extent possible, it is necessary to prevent the control data from including errors upon playback.

OBJECTS AND SUMMARY OF THE INVENTION

It is an object of the present invention to provide a method for error correction wherein error detection and correction codings are performed for digital data in six channels R through W among the aforementioned subcoding signals.

It is another object of this invention to provide a method for error correction wherein, in contrast to error detection by CRC, the error correcting ability is high and there is no need for a complicated circuit and a large buffer memory such as those required for error correction codes for the data in the main channel.

A further object of this invention is to provide a method for error detection and correction that can be performed on the basis of the dividing units.

An additional object of this invention is to provide a method for error correction and an apparatus for reproducing the information signals coded thereby wherein the error correction processing can be performed by a microcomputer since a data rate of the subcoding signals to be reproduced from a compact disc is relatively slow, thereby allowing the apparatus to be simple and low-priced.

A further another object of this invention is to provide a method for error correction wherein, if there are two kinds of transmission data, it is possible to code one of the transmission data so that it has an error correcting ability which is more effective than that of the other one.

A more specific object of this invention is to provide a method for error correction wherein, when different kinds of data are contained in the data to be transmitted through the same transmission line, some of the data being more significant than other data, the error detection or error correction and interleave processing is performed in such a manner that portions of the more significant data that are originally adjacent become more widely separated from each other than do portions of the less significant data that are originally adjacent, and that the more effective error detecting or error correcting ability is applied to the more significant data.

According to the present invention, a method for error correction is provided, wherein the error correction coding is performed on digital information data in subchannels to be transmitted, and wherein the improvement comprises the steps of: dividing digital information data in one PACKET into a plurality of PACKs; adding a first redundant code for error detection or error correction to each of the PACKs; and interleaving the digital information data in each of the PACKs and the first redundant code for error detection or error correction; the interleaved data being transmitted together with frame sync signals and main data.

Other objects, features and advantages of the present invention will become apparent from the following description of preferred embodiments while referring to the accompanying drawings, which show the details essential to the invention, and from the appended claims.

BRIEF DESCRIPTION OF THE DRAWINGS

FIGS. 3A, 3B, 4A, and 4B are schematic diagrams which are used for describing the subcoding signals of a compact disc;

FIGS. 5A–5C, 6A, and 6B show parity check matrices and reproduction data matrices of an error correction code in an embodiment of the present invention;

FIGS. 10–12 are schematic diagrams which are used for describing the interleave-processing by the error correction encoder according to the present invention;

DETAILED DESCRIPTION OF PREFERRED EMBODIMENTS

The data construction of the signal to be recorded on a compact disc will be described with reference to FIGS. 1 and 2.

Figure 1:
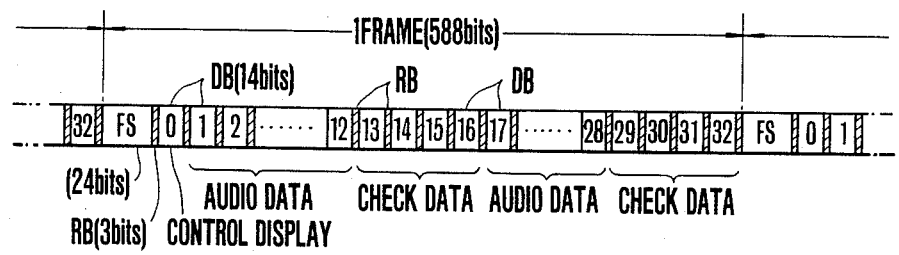
FIGS. 1 and 2 are schematic diagrams which are used for describing the constructions of the digital information data recorded on a compact disc in accordance with an embodiment of the present invention.

FIG. 1 shows the data stream recorded on a compact disc. One FRAME consists of 588 bits of record data, and each FRAME has at its head a 24-bit frame sync pulse FS of a specific bit pattern. The frame sync pulse FS is followed by DC-restriction bits RB (3 bits), which are used to suppress the DC components of the digital data to be transmitted. Thereafter, the 32 combinations consisting of the 0th–32nd data bytes DBs each having 14 bits and the 3-bit DC-restriction bits RB, alternately, are further recorded. The bits of the 0th byte DB are called a subcoding signal or user's bits, and are used to control the playback of a disc and to display the relating information or the like. The 1st–12th and 17th–28th data bytes DBs are assigned for audio data in the main channel. The remaining 13th–16th and 29th–32nd data bytes DBs are assigned for check data of the error correction code in the main channel. Each of the data bytes DBs consists of 14 bits into which the 8-bit data has been converted by the 8-14 conversion upon recording.

One BLOCK consists of 98 of the above-mentioned FRAMEs of digital signals, and various processings can be performed on the basis of such a BLOCK unit.

Figure 2:
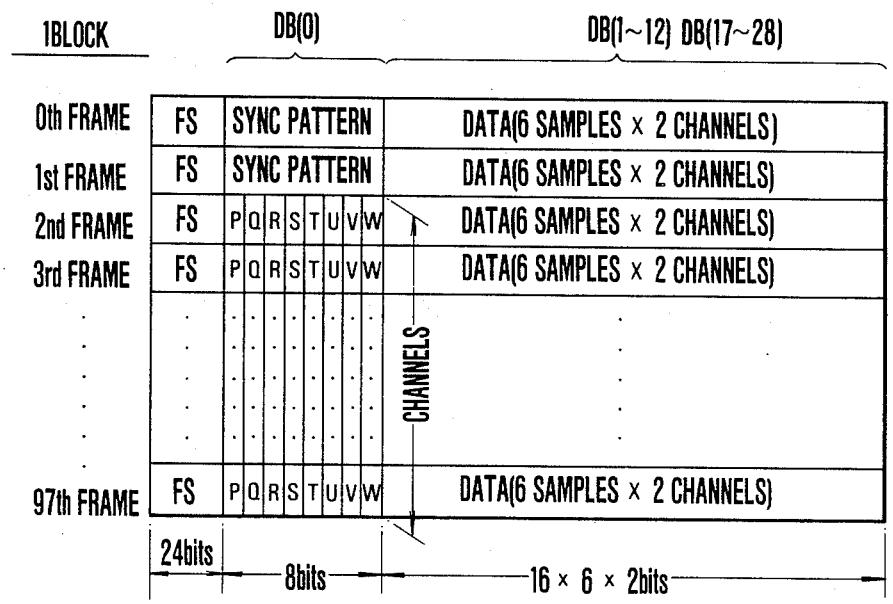

FIG. 2 shows the data construction of one BLOCK (98 FRAMEs) in that 98 FRAMEs are arranged sequentially in parallel, wherein each of the data bytes DBs is represented by 8 bits and the respective DC-restriction bits are excluded for simplicity of the figure. The subcoding signals P–W in the 0th and 1st FRAMEs form the sync patterns which are predetermined bit patterns. For the Q channel, the CRC codes for error detection are inserted in the latter 16 FRAMEs among the 98 FRAMEs.

The P-channel signal may be a flag to indicate a music program and a pause in that program. In a specific embodiment, the P-channel signal may be a two-level signal having a relatively lower level throughout the duration of a music program and a relatively higher level throughout the duration of a pause within or between such programs. In addition, the p-channel signal may appear as an alternating signal having a frequency on the order of about 2 Hz to define the lead-out section of the record disc. It will be appreciated, therefore, that detection and counting of this 2 Hz signal in the P channel are indicative of the lead-out section of the disc so as to suitably select and play back the designated music programs. The Q channel enables the more complicated control of this type. For example, when the Q-channel information is stored in a microcomputer equipped in the record disc playback device, it is possible to shift quickly from one music program to another and, moreover, from one portion of a program to yet another portion of a still further program during the playback of a music program; thus, respective ones of the recorded music programs may be selected at random by detecting and processing the above-mentioned Q-channel information. The other R through W channels can be used to indicate or explain by audible voice an author, composer, performers, explanation, poetry, title or the like of the music programs recorded on the record disc.

Figure 3A:
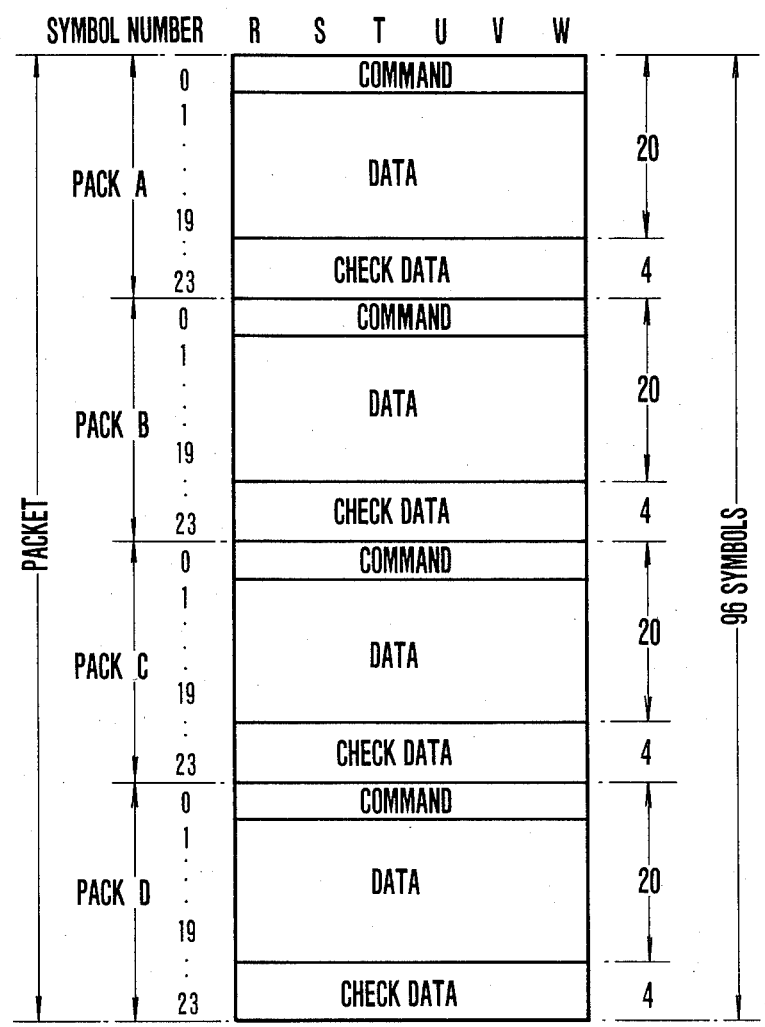
Figure 3B:
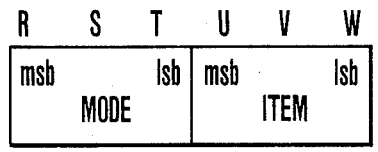

One PACKET consists of the subcoding data for the 96 frames excluding the sync pattern and P and Q channels among one BLOCK. As shown in FIG. 3A, this PACKET of (6×96) bits is further divided into four PACKs of A, B, C, and D, each having 24 SYMBOLs. The first SYMBOL of each PACK is a COMMAND, the subsequent 19 SYMBOLs are data, and the remaining 4 SYMBOLs are check data of the error correction code of each PACK. This COMMAND has six bits consisting of the 3-bit MODE and the 3-bit ITEM as shown in FIG. 3B.

The four 3-bit MODEs are defined:
(0 0 0): the ZERO-mode
(0 0 1): the GRAPHIC-mode
(0 1 0): the STILL-PICTURE-mode
(0 1 1): the SOUND-mode The three bits of the ITEM represent the information of the more detailed operational mode in each of the aforementioned operational modes. The ZERO-mode represents the case where no information is recorded in the R to W channels of the subcoding signals. In this ZERO-mode, as shown in FIG. 4A, all bits in the PACK including the six bits of MODE and ITEM are zero.

In the GRAPHIC-mode where the three bits of MODE are (0 0 1), as shown in FIG. 4B, the data in each PACK is arranged. When executing the GRAPHIC operation of the font such as characters, sentences, or the like with this GRAPHIC-mode, three bits of ITEM become (0 0 1); in the case of full-GRAPHIC to control the data in the entire display areas of the display device, three bits of ITEM become (0 1 0). The second SYMBOL in each PACK in this GRAPHIC-mode is INSTRUCTION. This INSTRUCTION gives an instruction necessary for control in the operational mode specified by a COMMAND consisting of MODE and ITEM.

The error correction coding processing is performed on the two SYMBOLS of COMMAND and INSTRUCTION in this GRAPHIC-mode, and the resultant 2-SYMBOL check data is added. The next 16 SYMBOLs 4–19 (FIG. 4B) in the PACK are used as a data area. The error correction coding processing is performed on the total 20 SYMBOLS in the PACK, and the resultant 4-SYMBOL check data is added.

Even in the STILL-PICTURE-mode or SOUND-mode, when predetermined COMMAND and INSTRUCTION are used, the error correction coding processing is also performed in the same way as above.

A (24, 20) REED-SOLOMON code is used as an error correction code for the PACK of (6×24) bits. This REED-SOLOMON code is expressed by a polynomial, $$(P(X) = X^6 + X + 1)$$

over GF($2^6$), wherein GF represents a Galois field. The check matrix $H_p$ of this REED-SOLOMON code such as shown in FIG. 5A or 5B is used. The primitive element a over GF($2^6$) is $$a = [0\ 0\ 0\ 0\ 1\ 0]$$

One PACK of the reproduction data is expressed by the reproduction data matrix $V_p$ as shown in FIG. 5C. Each suffix added to the respective 24 SYMBOLs indicates the SYMBOL number of the subcoding signals, and a character n in this suffix represents a PACK No. $S_{24n}$ is a COMMAND, $S_{24n+1}$ is an INSTRUCTION, $Q_{24n+2}$ and $Q_{24n+3}$ are check data SYMBOLs for this COMMAND and INSTRUCTION, and $P_{24n+20}$, and $P_{24n+21}$, $P_{24n+22}$, and $P_{24n+23}$ are check data SYMBOLs of such PACKs as described above. The check data of these four SYMBOLs satisfies ($H_p \cdot V_p = 0$).

The (4, 2) REED-SOLOMON code is used as an error correction code for COMMAND and INSTRUCTION. This REED-SOLOMON code is expressed by a polynomial, $$(P(X) = X^6 + X + 1)$$

over GF($2^6$). The check matrix $H_q$ and the reproduction data matrix $V_q$ are as shown in FIGS. 6A and 6B. The primitive element a over GF($2^6$) is $$a = [0\ 0\ 0\ 0\ 1\ 0]$$

The check data SYMBOLs $Q_{24n+2}$ and $Q_{24n+3}$ satisfy ($H_q \cdot V_q = 0$). In one form of the preferred embodiment, (n=2), (k=2), (m=16), and (b=4).

The REED-SOLOMON code including four P-check-data SYMBOLs can correct 1-SYMBOL error and 2-SYMBOL errors and detect 3-or-more-SYMBOL errors. The REED-SOLOMON code including two Q SYMBOLs can correct 1-SYMBOL error and detect 2-or-more-SYMBOL errors.

Figure 7:
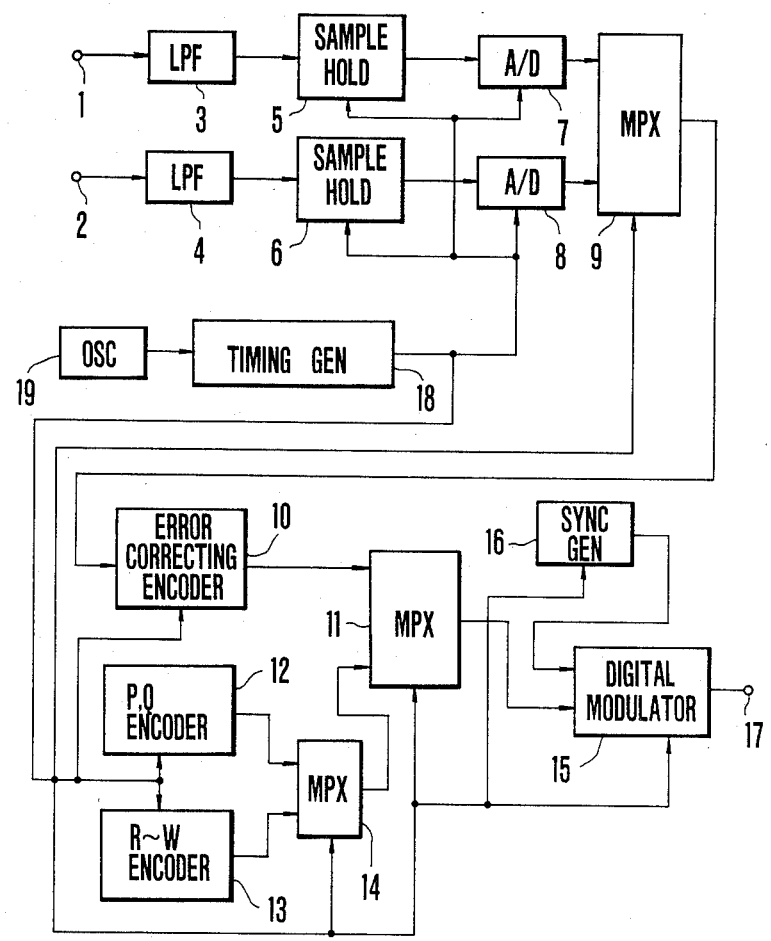
FIG. 7 is a block diagram showing the circuitry of the recording system of an embodiment of the present invention.

FIG. 7 is a block diagram of the fundamental circuitry of the recording system to produce the data to be recorded on a compact disc. In FIG. 7, reference numerals 1 and 2 indicate input terminals to which 2-channel audio signals such as stereophonic signals are supplied from a tape-recorder or other sources. Audio signals in each channel are supplied through low-pass filters 3 and 4 to sample holding circuits 5 and 6, and further converted into 16-bit signals in each sample by A/D converters 7 and 8. These 2-channel audio PCM signals are converted into 1-channel signal by a multiplexer 9 and supplied to an error correction encoder 10.

The error correction encoder 10 cross-interleaves the audio PCM signal to code for allowing the error correction to be performed by the REED-SOLOMON code. The cross-interleave-processing serves to rearrange the data sequence so that each SYMBOL is contained in two different error correction code series. The output of this error correction encoder 10 is supplied to a muliplexer 11.

There are further provided an encoder 12 with respect to the P and Q channels of the subcoding signals and an encoder 13 with respect to the R through W channels, and their respective outputs are synthesized by a multiplexer 14 and supplied to the multiplexer 11. The output of the multiplexer 11 is supplied to a digital modulator 15, where it is modulated from 8 bits to 14 bits. Frame syncs from a sync signal generator 16 are added to the digital modulator 15 and output from an output terminal 17. The encoder 12 for the P and Q channels has such a construction that it adds a 16-bit CRC code (cyclic redundancy check code) to the Q-channel data. The encoder 13 for the R–W channels performs the error correction coding using the REED-SOLOMON code and interleave-processing.

Clock pulses and timing signals formed by a timing generator 18 are supplied to each circuit of the sample holding circuits 5 and 6, A/D converters 7 and 8, multiplexers 9, 11 and 14, and the like. A reference numeral 19 indicates an oscillator for generating master clocks.

Figure 8:
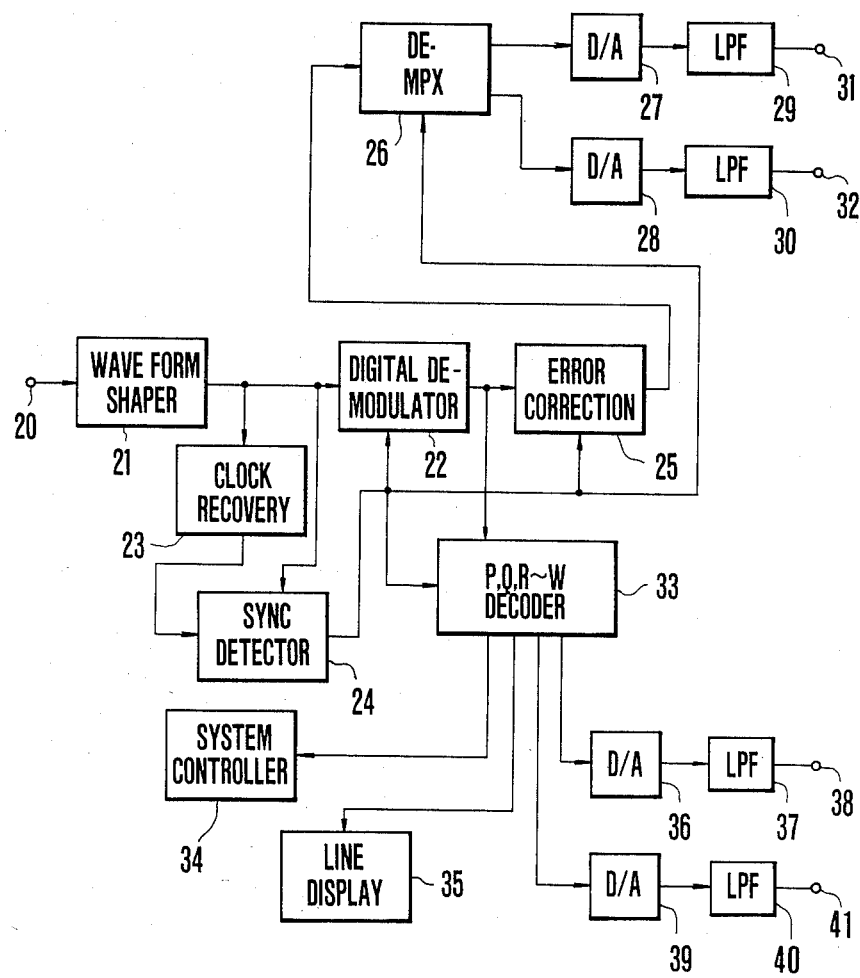
FIG. 8 is a block diagram showing the circuitry of the reproducing system of an embodiment of the present invention.

FIG. 8 is the block diagram of the circuitry of the reproducing system for processing the reproduction signals of a compact disc. In FIG. 8, the signal reproduced optically from a compact disc is supplied to an input terminal indicated by a reference numeral 20.

This reproduction signal is supplied through a waveform shaping circuit 21 to a digital demodulator 22, clock recovery circuit 23, and a sync detection circuit 24. The bit clock which is synchronized with the reproduction data is taken out by the clock recovery circuit 23 having a PLL (phase locked loop) construction. The sync detection circuit 24 detects the frame sync and generates timing signals synchronized with the reproduction data, and supplies predetermined timing signals to each circuit of the reproducing system.

The data in the main channel among the outputs of the digital demodulator 22 is subject to processings for error detection, error correction, and interleaving by an error correction circuit 25. The subcoding signals are subject to processings for error detection and error correction by a decoder 33.

The output of the error correction circuit 25 is supplied to a demultiplexer 26 to be divided into two channels. The respective outputs in each channel pass through a D/A converter 27 and a low-pass filter 29, and a D/A converter 28 and a low-pass filter 30. The reproduction audio signals in each channel appear at output terminals 31 and 32.

The data in the P and Q channels of the subcoding signals obtained from the decoder 33 is supplied to a system controller 34 comprising a microcomputer. This data is used to execute the rapid access operation for reproducing the beginnings of music programs, random selecting operation, or other operations. The time code included in the Q channel is supplied to a line display 35 for indication on the display.

The picture display data included in the R–W channels is converted into analog data by a D/A converter 36, then taken out at an output terminal 38 through a low-pass filter 37. This display signal is supplied to a CRT display. Furthermore, the audio data such as explanations of music programs which are included in the R through W channels is taken out at an output terminal 41 through a D/A converter 39 and a low-pass filter 40, then supplied through a low-frequency amplifier to a speaker (not shown).

Figure 9:
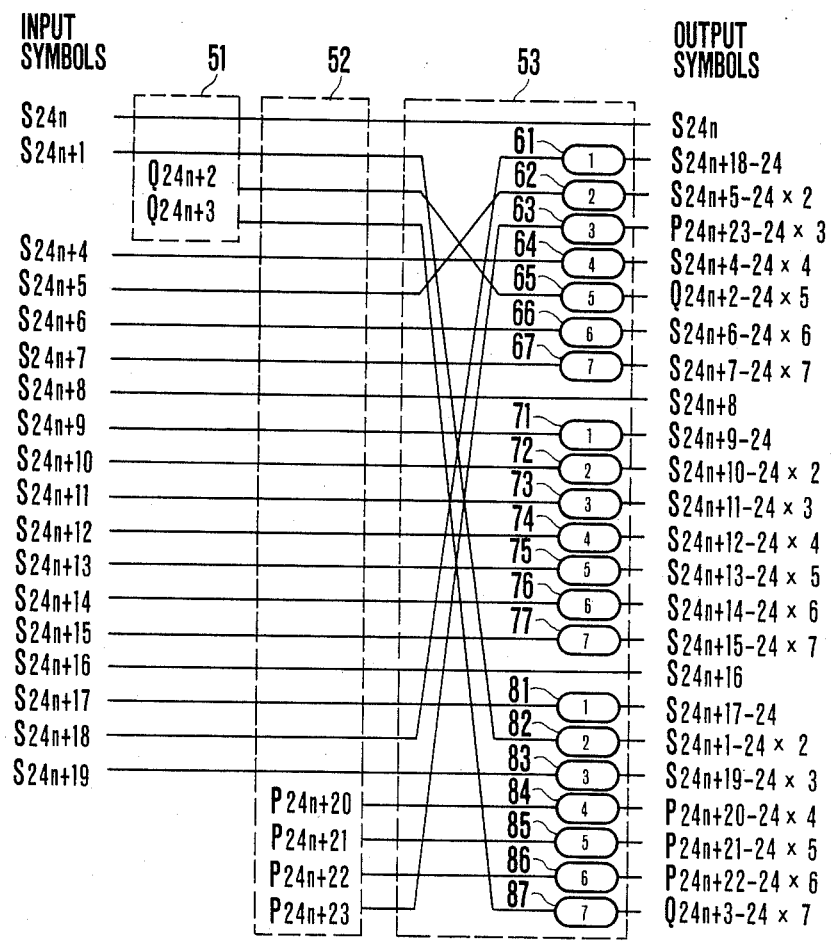
FIG. 9 is a block diagram showing the construction of the error correction encoder in an embodiment of the present invention.

The encoder 13 (FIG. 7) concerning the R–W channels is provided with an error correction encoder shown in FIG. 9.

The error correction encoder consists of, as shown by the broken lines, a Q-check-data generator 51 of the previously mentioned (4, 2) REED-SOLOMON code, a P-check-data generator 52 of the aforementioned (24, 20) REED-SOLOMON code, and an interleaving circuit 53. The total 18 SYMBOLs of $S_{24n}$, $S_{24n+1}$, and $S_{24n+4}$ through $S_{24n+19}$ in the nth PACK are input to this error correction encoder.

The two SYMBOLs $S_{24n}$ and $S_{24n+1}$ are supplied to the Q-check-data generator 51 to generate the two check data SYMBOLs of $Q_{24n+2}$ and $Q_{24n+3}$. The 20 SYMBOLs including this Q check data are input to the P-check-data generator 52 to generate the four check data SYMBOLs. The 24 SYMBOLs to be output from this P-check-data generator 52 are supplied to the interleaving circuit 53.

The interleaving circuit 53 is constructed by an RAM and its address controller and generates the output data of which a predetermined delay time value has been added to each SYMBOL of the input data by controlling the write addresses and the read addresses. As shown in FIG. 9, means for adding the predetermined delay time value to each SYMBOL is represented as a plurality of delay elements for simplicity of understanding. The following delay elements are used:

Delay elements 61, 71, 81—to give a delay time value of 1 PACK (24 SYMBOLs).

Delay elements 62, 72, 82—to give a delay time value of 2 PACKs.

Delay elements 63, 73, 83—to give a delay time value of 3 PACKs.

Delay elements 64, 74, 84—to give a delay time value of 4 PACKs.

Delay elements 65, 75, 85—to give a delay time value of 5 PACKs.

Delay elements 66, 76, 86—to give a delay time value of 6 PACKs.

Delay elements 67, 77, 87—to give a delay time value of 7 PACKs.

The delay time value of the SYMBOL in which no delay element is inserted is set to 0. As described above, the three combinations consisting of the eight kinds of delay time values of 0 to 7 PACKs are provided.

This interleaving circuit 53 performs an interleave-processing as shown in FIG. 10. In FIG. 10, there are shown in parallel the eight sequential PACKs in the input data series and the output data series having the same length as the input data series. Referring to the first PACK A (shown by the area indicated by the oblique lines) in the input data series, the 24 SYMBOLs in this PACK A are interleaved into the locations which are apart by only a distance of 8 or 9 SYMBOLs in the output data series. If the output data series are divided into equal intervals each consisting of 8 SYMBOLs, 3 SYMBOLs in the PACK A are arranged as the head SYMBOL into each of the first to third 8-SYMBOL groups in the output data series. The next three SYMBOLs in the above-mentioned PACK A are arranged as the second SYMBOL into each of the 4th to 6th 8-SYMBOL groups.

In the same manner as above, the respective 3 SYMBOLs in the PACK A are arranged into the locations where each SYMBOL is shifted for every three 8-SYMBOL groups. Consequently, the 3 SYMBOLs in the PACK A are arranged as the 8th SYMBOL of each group into the final three 8-SYMBOL groups in the output data series shown in FIG. 10. Among 24 SYMBOLS consisting of these three 8-SYMBOL groups, the SYMBOLs in the above-mentioned PACK A are arranged with the distance of each eight SYMBOLs. In the boundary between the three 8-SYMBOL groups and the next three 8-SYMBOL groups, the distance of nine SYMBOLs exists since one SYMBOL is shifted.

The SYMBOLs in a plurality of PACKs with the timings which are later than the PACK A are arranged by being interleaved in the same manner as the PACK A into the locations before the locations where the SYMBOLs in the PACK A have been arranged among the 8-SYMBOL groups. Furthermore, the SYMBOLs in a plurality of PACKs with the timing periods before the PACK A are arranged by being interleaved similarly to the PACK A into the locations after the locations where the SYMBOLs in the PACK A have been arranged among the 8-SYMBOL groups.

According to the actual measurement of the error states in the subcoding signals reproduced from a compact disc, the burst errors of four or more SYMBOLs were hardly detected. Therefore, by dispersedly recording (namely, by interleaving) the 24 SYMBOLs included in the same series of the (24, 20) REED-SOLOMON code in the manner described above, it is possible to effect prevent that the error correction even upon the occurrence of 2-or-more-SYMBOL errors.

Returning to FIG. 9, the interleaving circuit 53 serves to interleave so that the distances between the COMMANDs, INSTRUCTIONs, and SYMBOLs of these Q check data which are included in the same PACK become larger than those of the other SYMBOLs. For this purpose, as shown in FIG. 9, the interleaving circuit 53 includes the six oblique supplying lines, in other words, all of the supplying lines of the input SYMBOLs for each delay element are not parallel.

Figure 11:
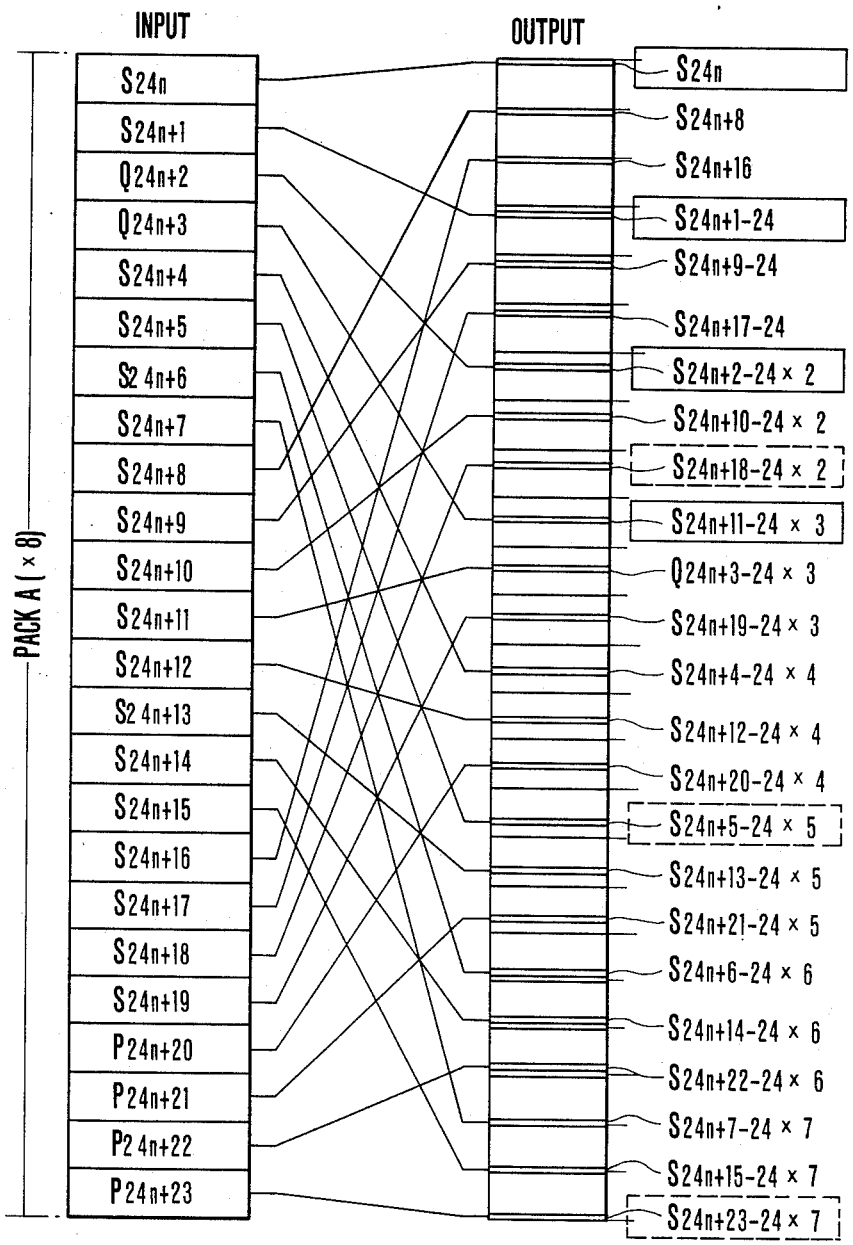
Figure 12:
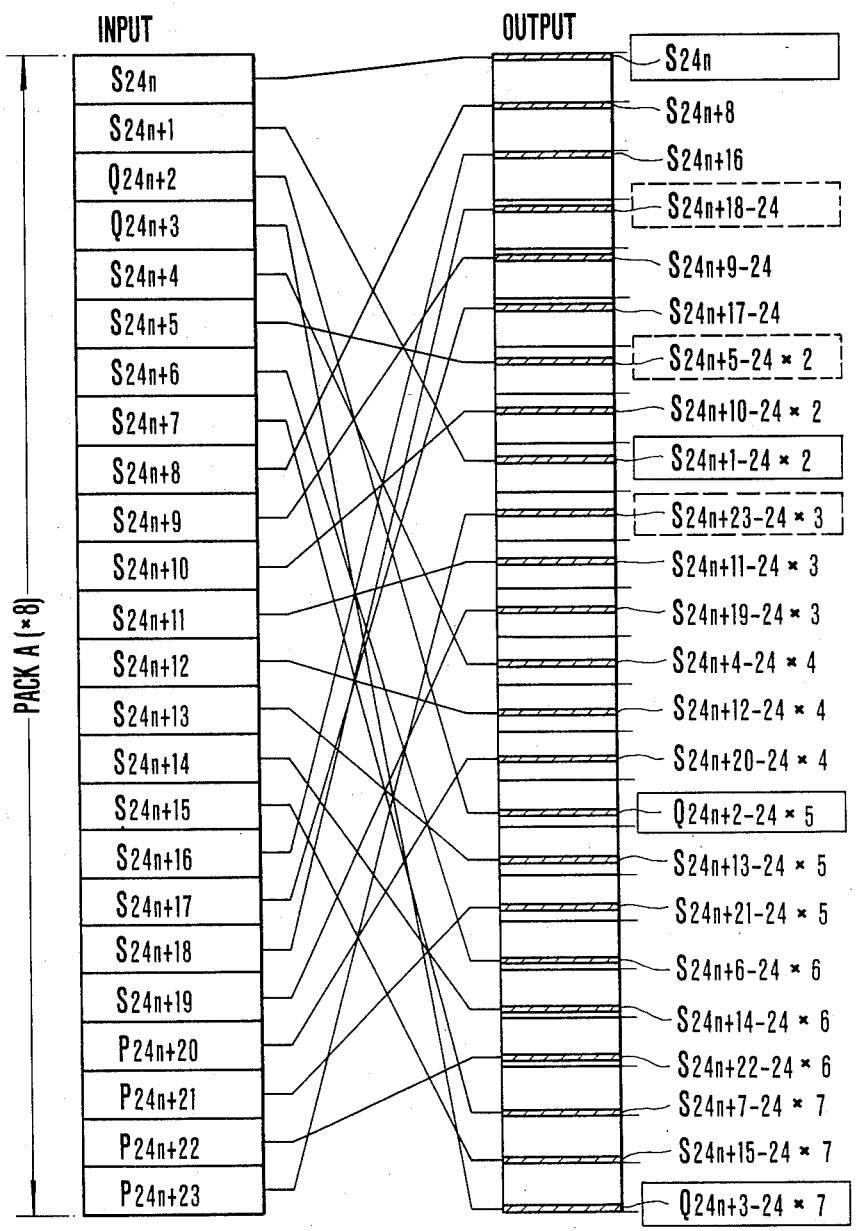

According to an embodiment of the present invention, the construction shown in FIG. 9 is changed so that all of the supplying lines of the input SYMBOLs are parallel. FIG. 11 shows the relationship between the 24 SYMBOLs in one PACK and the locations of the data in the output series after interleaving in such a case. In FIG. 11 and FIG. 12, which will be described later, the time width of one PACK of the input data is increased by eight times the inherent time width.

As shown in FIG. 11, the delay time values of 0, 1, 2, 3, ... 7 PACKs are respectively given to the first eight SYMBOLs $S_{24n}$, $S_{24n+1}$, $Q_{24n+2}$, $Q_{24n+3}$, ... $S_{24n+7}$ of the input SYMBOLs. Hence, these eight SYMBOLs change to the SYMBOLs whose SYMBOL numbers are $(-24)$, $(-24 \times 2)$, $(-24 \times 3)$, ... $(-24 \times 7)$ in the output data series. The delay time values of 0, 1, ... 7 PACKs are also given to the next eight SYMBOLs $S_{24n+8}$, ... $S_{24n+15}$ of the input SYMBOLs, respectively. Furthermore, the same delay time values are also given to the next eight SYMBOLs $S_{24n+16}$, ... $S_{24n+23}$, respectively. As a result of such an interleave-processing, the mutual distances of the first four SYMBOLs in the PACK become equally 24 SYMBOLs.

In another embodiment of the present invention, as shown in FIG. 9, the interleaving circuit 53 is used so that the SYMBOL $S_{24n+1}$ is supplied to the delay element 82, the SYMBOL $S_{24n+18}$ is supplied to the delay element 61; similarly, the SYMBOL $Q_{24n+2}$ to the delay element 65, the SYMBOL $S_{24n+5}$ to the delay element 62, the SYMBOL $Q_{24n+3}$ to the delay element 87, and the SYMBOL $P_{24n+23}$ to the delay element 63. Therefore, a pair of mutual locations of the above-mentioned SYMBOLs are exchanged, so that the relationship between the input data series and the data series after interleaving is as shown in FIG. 12. As will be obvious from FIG. 12, the mutual distances of the first four SYMBOLs in the PACK are as shown below.

The distance between $S_{24n}$ and $S_{24n+1}$: 65 SYMBOLS

The distance between $S_{24n+1}$ and $Q_{24n+2}$: 58 SYMBOLs

The distance between $Q_{24n+2}$ and $Q_{24n+3}$: 65 SYMBOLs

As described above, it is possible to increase the mutual distances of the four SYMBOLs by two or more times as compared with the 25 SYMBOLs, and to elevate the error correcting ability for the burst errors which may occur in the reproduction data.

As described above, it is desirable to set the distances between the SYMBOLs of the control data after interleave-processing so as to be maximum; however, there is also an exceptional case where it is not always necessary to set the maximum distance in consideration of the length of the burst errors which could be caused in the transmission line to be used.

Figure 13:
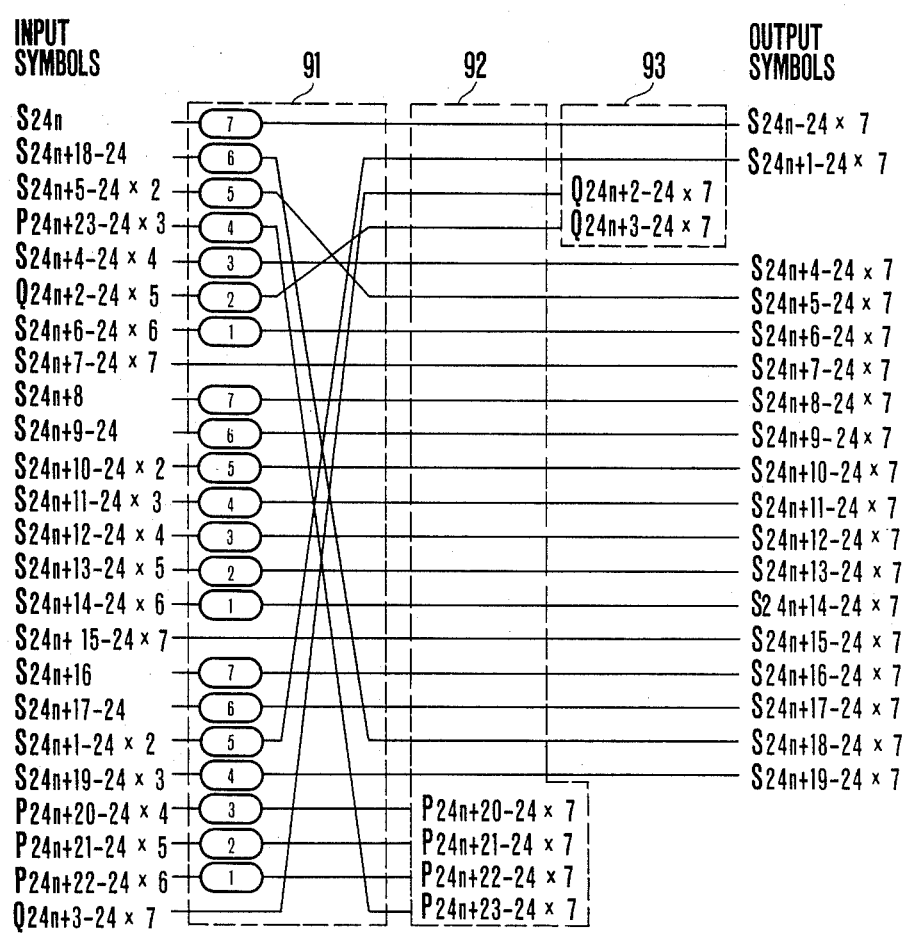
FIG. 13 is a block diagram showing the construction by the error correction decoder in an embodiment of the present invention.

FIG. 13 shows an error correction decoder with respect to the R through W channels provided in the decoder 33 for the subcoding signals of the reproducing system.

This error correction decoder comprises, as shown by the broken lines, a de-interleaving circuit 91 to which the 24 SYMBOLs in one PACK of the reproduced subcoding signals are supplied, a P-decoder 92 of the (24, 20) REED-SOLOMON code to which the output of this de-interleaving circuit 91 is supplied, and a Q-decoder 93 of the (4, 2) REED-SOLOMON code to which the four SYMBOLs to be output from this P-decoder 92 are supplied.

In contrast to FIG. 13, the Q-decoder 93 may be provided at the front stage of the P-decoder 92. It may be also possible to generate the flag code indicating the contents (i.e., no error, the correction of 1-SYMBOL error, correction of 2-SYMBOL error, and detection of 3-or-more-SYMBOL errors) of the error detection and error correction which have been executed by the P-decoder 92 (or Q-decoder 93) and to utilize this flag code for the error correction processing in the Q-decoder 93 (or P-decoder 92).

The input data to the de-interleaving circuit 91 corresponds to the output data from the interleaving circuit 53 in FIG. 9. The interleave-processing is performed so that the delay time values given by this interleaving circuit 53 are cancelled and each SYMBOL has evenly the delay time values of seven PACKs. Actually, this de-interleaving is performed by controlling the write addresses and read addresses in the RAM. As shown in FIG. 13, the de-interleaving circuit 91 is constructed so that the delay elements having predetermined delay time values are arranged in the transmission lines of each SYMBOL. The delay elements of seven PACKs are inserted into the transmission lines of the SYMBOLs having the delay time value of 0 in the interleaving circuit 53, respectively. The delay elements of 6, 5, 4, 3, 2, and 1 PACKs are inserted respectively into the transmission lines of the SYMBOLs having the delay time values of 1, 2, 3, 4, 5, and 6 PACKs in the interleaving circuit 53. No delay element is inserted into the transmission line of the SYMBOL having the delay time value of seven PACKs in the interleaving circuit 53.

The P-decoder 92 has a syndrome generator to generate four syndromes by calculation of $(H_p \cdot V_p)$. If there is no error, these four syndromes are all zero. Checking these four syndromes enables the detections of a 1-SYMBOL error, 2-SYMBOL error, and 3-or-more-SYMBOL errors, and obtaining the error locations of the 1-SYMBOL error and 2-SYMBOL error enables the correction of these errors.

The Q-decoder 93 has a syndrome generator to generate two syndromes by calculation of $(H_q \cdot V_q)$. By utilizing these two syndromes, it is possible to correct a 1-SYMBOL error and to detect 2-or-more-SYMBOL errors.

It may be possible to use a complete-type interleave-processing in that the SYMBOLs in a plurality of PACKs are written in the RAM and the above-mentioned SYMBOLs in a plurality of PACKs are read from the RAM using the read addresses in a sequence different from a change in these write addresses.

Figure 14:
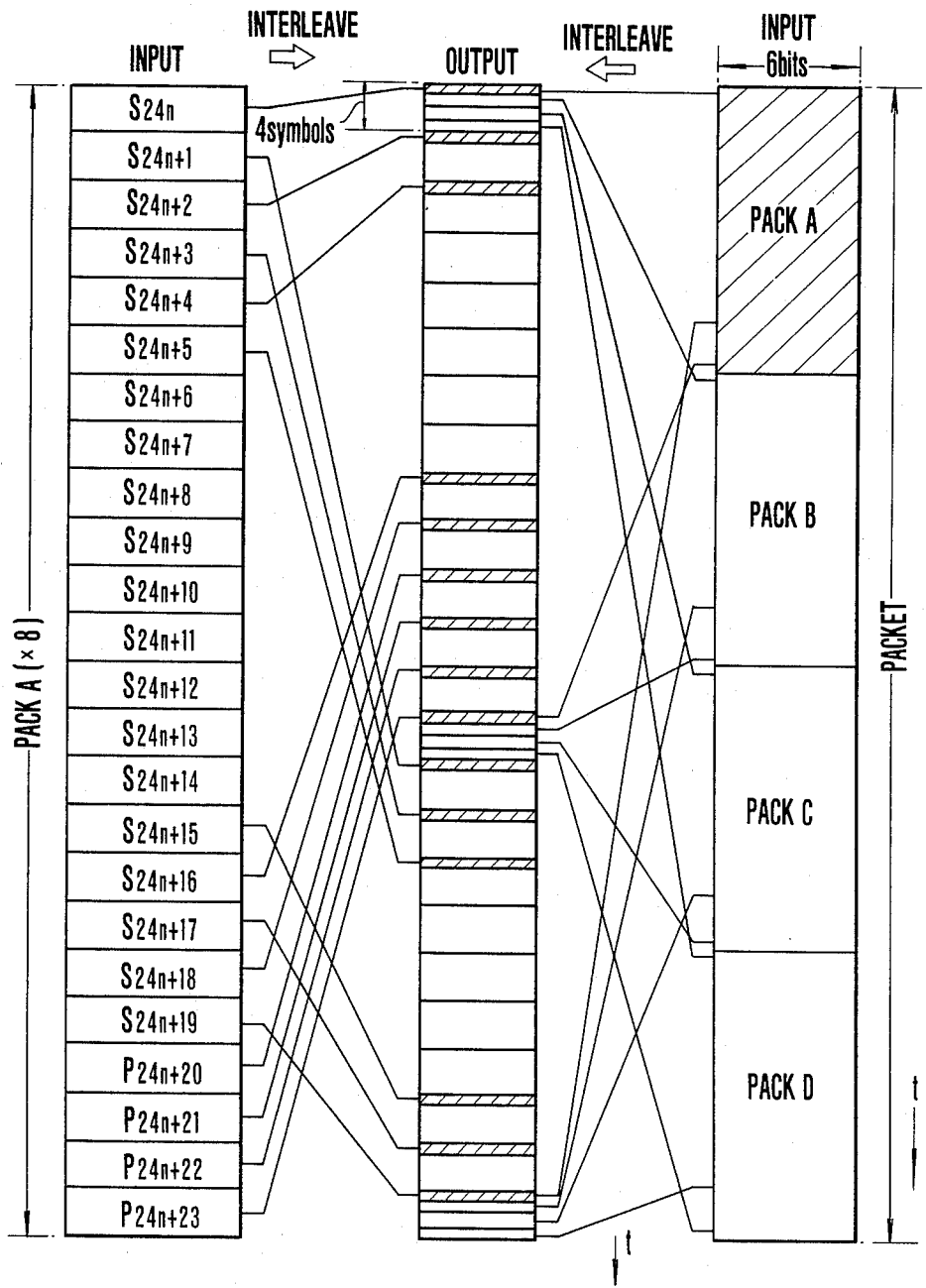
FIGS. 14 and 15 are schematic diagrams which are used for describing the interleave-processing in other embodiments by the error correction encoder according to the present invention.

As shown in an enlarged schematic diagrams of FIG. 14, for example, the PACK A includes the twenty information SYMBOLs of $S_{0A}, S_{1A}, \ldots S_{19A}$ and the four check codes of $P_{0A}, P_{1A}, P_{2A}$, and $P_{3A}$. When recording on a disc, these SYMBOLs in the four PACKs A, B, C, and D are interleaved.

In the example shown in FIG. 14, all of the 20 SYMBOLs in one PACK are used as the data and the two P and Q check data as described above are not used. However, this difference will not cause the essential difference between the constructions of the error correction encoder and the error correction decoder. Namely, the encoder and decoder are constituted so that they can correspond to two check codes similar to those shown in FIGS. 9 and 13, and so that the control data (e.g., INSTRUCTION) determines whether the Q-check-data generator and the Q-decoder are made operative or not.

The interleave-processing shown in FIG. 14 is performed as follows. That is to say, the recording areas for the 96 SYMBOLs divided by the syncs of the subcoding signals are divided into 24 areas each having four SYMBOLs. The SYMBOL taken out of the PACK A is arranged as the first SYMBOL. The SYMBOL taken out of the pack B is arranged as the second SYMBOL. The SYMBOL taken out of the PACK C is arranged as the third SYMBOL. And the SYMBOL taken out of the PACK D is arranged as the fourth SYMBOL. By performing such an interleave-processing, it is possible to diminish the occurrence of 3-or-more-word errors due to the burst error.

Furthermore, as shown in FIG. 14, the ten information SYMBOLs bearing even numbers among the 20 information SYMBOLs included in each PACK are recorded among the first 40 output SYMBOLs. The ten information SYMBOLs bearing odd numbers are recorded among the last 40 output SYMBOLs. The parity SYMBOLs are recorded among the 16 output SYMBOLs located intermediately in the order of $(P_0 \rightarrow P_2 \rightarrow P_1 \rightarrow P_3)$. As described above, since the information SYMBOLs bearing even and odd numbers are recorded in locations which are as far apart as possible, it is possible to improve interpolating capability when error correction is impossible.

In another embodiment of the present invention, the buffer required to decode is (96×6 bits=576 bits), the restricted length (in each PACK) of the code is 93 SYMBOLs, and the length which can be interpolated is 52 SYMBOLs.

Figure 15:
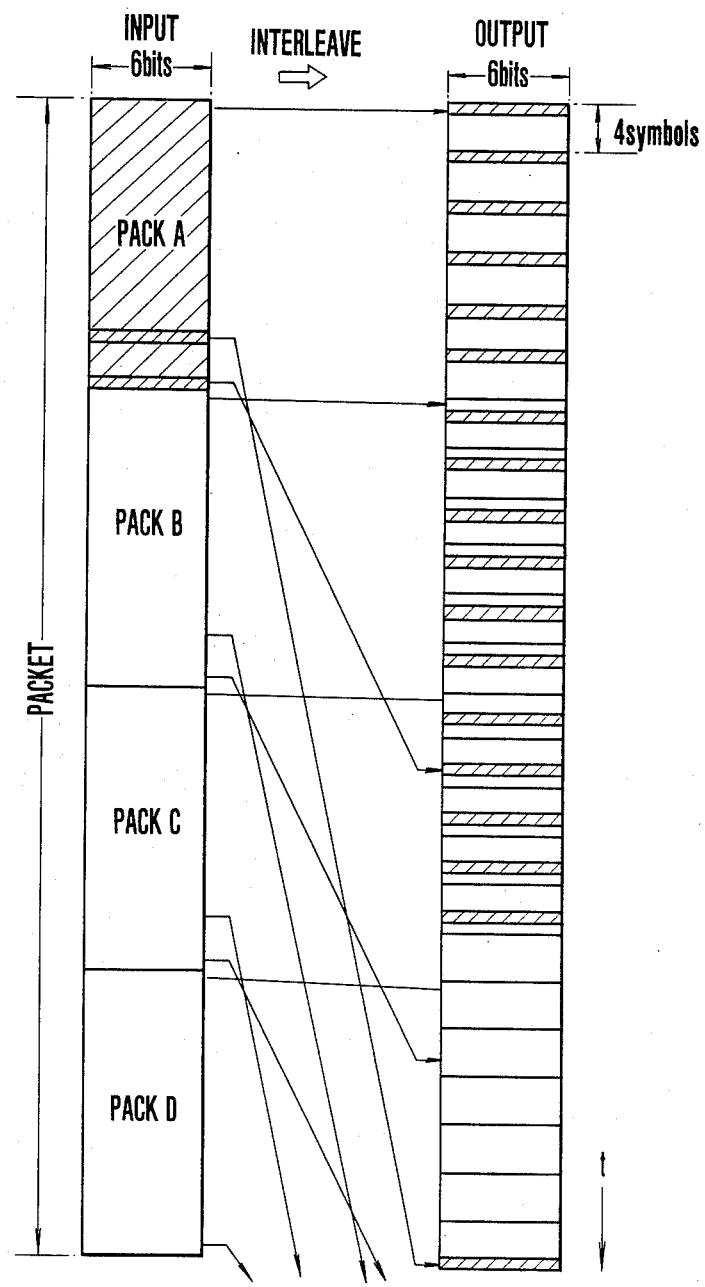

FIG. 15 shows the error detection and correction coding of the subcoding signals in still another embodiment of the present invention.

In the same manner as FIG. 14 described above, the recording areas for the 96 SYMBOLs are divided into four areas, and the SYMBOL series in the PACK A is recorded in the inherent recording areas for the 96 SYMBOLs as shown by the oblique lines in FIG. 15.

The six SYMBOLs among the SYMBOLs in this PACK A are recorded in the first locations in the sections divided so as to have four SYMBOLs respectively. In the same way as above, each group consisting of the six SYMBOLs is recorded into the second, third, and fourth locations, respectively.

The SYMBOL series in the PACK B is recorded between the locations from the second position among the four areas thus divided to the second position among the recording areas of the next 96 SYMBOLs. The SYMBOL series in the PACK C is recorded between the locations from the third position to the third position among the next recording areas. The SYMBOL series in the PACK D is recorded between the locations from the fourth position to the fourth position among the next recording areas.

The interleave-processing for the SYMBOL series in these PACKs B, C and D is the same as PACK A.

As described above, the buffer of ($104 \times 6$ bits=624 bits) is required to decode in the specific embodiment of the present invention in this case where the subcoding signals are recorded over other recording areas. The restricted lengths of the codes are 96 SYMBOLs in the case of PACK A, and 98 SYMBOLs (because the sync pattern is included) in the cases of PACKs B, C and D. Therefore, the interpolated length, for example, the length when the SYMBOL $S_{2A}$ is interpolated by a mean value of the SYMBOLs $S_{1A}$ and $S_{3A}$ becomes 58 SYMBOLs.

In the above description, the same error correction coding and error correction decoding processings are performed for the 96 SYMBOLs (PACKs A–D) of the subcoding signals. However, different processings may be performed for each PACK in accordance with the contents of information of the subcoding signals. The first SYMBOL (in FIG. 2, the second data FRAME) among the 96 SYMBOLs is used as a header indicating the contents of information in each PACK and a difference between the error correction processings as described above. This header is included in the PACK A.

Therefore, in the case of picture information in which errors are inconspicuous, it may be possible to perform the error correction processing for only the PACK A which inclues a header and to perform the interpolation processing for other PACKs.

Furthermore, the present invention is not limited to the data to be recorded on a compact disc, but it may be applied to the data to be recorded on other record media such as a magnetic tape or the like and to the error correction coding of the transmission data of the videotex system.

Codes other than the REED-SOLOMON code may be used as error correction codes. It is also possible to use an error detection code such as a CRC code for one of the two kinds of data and to use a different error correction code for the other. An error correction code of the bit unit such as a BCH code may be used instead of an error correction code of the SYMBOL unit.

According to the present invention, in contrast to error detection by CRC, it is possible to realize error correcting which provides high correcting ability by combining interleave-processing and error correction coding processing in each dividing unit without a complicated circuit or a large buffer memory. Moreover, according to the present invention, it is possible to perform different error detection and correction on the dividing unit basis due to a difference in the picture information and the audio information since the error detection and correction processings are performed on the dividing unit basis. Furthermore, since the data rate of the subcoding signals to be reproduced from a compact disc is relatively slow, error correction processing can be performed using a microcomputer, resulting in a simple and low-priced construction.

According to the invention, if there are two kinds of data as transmission data, it is possible to code one of them so that it has the error correcting ability which is more effective than that of the other one.

In an example of the subcoding signals of a compact disc, the dual error correction coding processings of the (24, 20) REED-SOLOMON code and the independent (4, 2) REED-SOLOMON code are performed on the four SYMBOLs having the information concerning the operational mode and the contents of controls. The interleave-processing is performed on these four SYMBOLs so that they are interleaved mutually as far apart as possible as compared with the distances between other SYMBOLs.

These dual processings increase the error correcting ability of the four SYMBOLs. Moreover, it will be easily understood that such processings will not affect the error correction coding at all which is performed on the PACK unit basis so as to reduce its error correcting ability.

Although preferred embodiments of the invention are specifically illustrated and described herein, it will be appreciated that many modifications and variations of the present invention are possible in light of the above teachings and within the purview of the appended claims without departing from the spirit and intended scope of the invention.

What is claimed is:

1. A method of processing digital data including main data and subcoding data ancillary thereto; comprising the steps of:
    grouping said subcoding data into a plurality of PACKETs, each PACKET comprising a plurality of PACKs, each PACK comprising a plurality of SYMBOLs and each SYMBOL comprising a plurality of bits;
    adding a first redundant code for error detection or error correction to each of said PACKs;
    interleaving said subcoding data and said first redundant code in accordance with a first format to form interleaved data; and
    combining said interleaved data and said main data for transmission.

2. The method as claimed in claim 1; wherein at least one of said PACKs includes digital data indicative of the information contents of said PACKET.

3. The method as claimed in claim 1; wherein at least one of said PACKs includes digital data to indicate a method of processing for error detection or error correction of said PACKET.

4. The method as claimed in claim 1; wherein each of said PACKs includes digital data indicative of the information contents of each of said PACKs.

5. The method as claimed in claim 4; further comprising the step of adding a second redundant code for error detection or error correction to each of said PACKs.

6. The method as claimed in claim 5; further comprising the step of interleaving said digital data indicative of said information contents and said second redundant code in accordance with a second format different from said first format.

7. Apparatus for processing digital data including main data and subcoding data ancillary thereto; comprising:
- means for grouping said subcoding data into a plurality of PACKETs, each PACKET comprising a plurality of PACKs, each PACK comprising a plurality of SYMBOLs and each SYMBOL comprising a plurality of bits;
- means for adding a first redundant code for error detection or error correction to each of said PACKs; and
- means for interleaving said subcoding data and said first redundant code in accordance with a first format to form interleaved data; and
- means for combining said interleaved data and said main data for transmission.

8. The apparatus as claimed in claim 7; wherein at least one of said PACKs includes digital data indicative of the information contents of said PACKET.

9. The apparatus as claimed in claim 7; wherein at least one of said PACKS includes digital data to indicate a method of processing for error detection or error correction of said PACKET.

10. The apparatus as claimed in claim 7; wherein each of said PACKs includes digital data indicative of the information contents of each of said PACKs.

11. The apparatus as claimed in claim 10; further comprising means for generating a second redundant code for error detection or error correction and for adding said second redundant code to each of said PACKs.

12. The apparatus as claimed in claim 11; further comprising means for interleaving said digital data indicative of said information contents and said second redundant code in accordance with a second format different from said first format.

13. A method of error correction of data including n SYMBOLs representing a first kind of information and m SYMBOLs representing a second kind of information, each of said SYMBOLs comprising a plurality of bits; said method comprising the steps of:
- supplying said n SYMBOLs and encoding a first error detection code or error correction code to generate a redundant code of k SYMBOLs for said n SYMBOLs;
- supplying said m SYMBOLs and encoding a second error detection code or error correction code to generate a redundant code of l SYMBOLs for said m SYMBOLs; and
- interleaving said (n+k+m+l) SYMBOLs to form a series having a predetermined length of a plurality of SYMBOLs wherein the separations among said (n+k) SYMBOLs exceed those of said (m+l) SYMBOLs.

14. Apparatus for reproducing digital subcoding data ancillary to main data, the subcoding data being grouped into a plurality of PACKETs, each PACKET comprising a plurality of PACKs, each PACK comprising a plurality of SYMBOLs and each SYMBOL comprising a plurality of bits, said subcoding data and a first redundant code for error detection or error correction being interleaved in accordance with a first format to form interleaved data, said interleaved data being combined with said main data; said apparatus comprising:
- means responsive to said interleaved data and said main data for separating said interleaved data from said main data to form separated interleaved data;
- means responsive to said separated interleaved data for de-interleaving said subcoding data and said first redundant code in each of said PACKs to form de-interleaved data; and
- means for performing error detection or error correction on said de-interleaved data, thereby reproducing said subcoding data.

15. Apparatus as claimed in claim 14; wherein at least one of said PACKs includes digital data indicative of the information contents of said PACKET.

16. Apparatus as claimed in claim 14; wherein at least one of said PACKs includes digital data to indicate a method of processing for error detection or error correction of said PACKET.

17. Apparatus as claimed in claim 14; wherein each of said PACKs includes digital data indicative of the information contents of each of said PACKs.

18. Apparatus as claimed in claim 17; further comprising means for generating a second redundant code for error detection or error correction and adding said second redundant code to each of said PACKs, said first redundant code providing a means of detecting or correcting errors in a first plurality of SYMBOLs and said second redundant code providing a means of detecting or correcting errors in a second plurality of SYMBOLs in each of said PACKs.

* * * * *